(12) United States Patent
Rogers et al.

(10) Patent No.: US 7,000,418 B2
(45) Date of Patent: Feb. 21, 2006

(54) CAPACITANCE SENSING FOR SUBSTRATE COOLING

(75) Inventors: James H. Rogers, Santa Clara County, CA (US); Brian Hoffman, Deschutes County, OR (US)

(73) Assignee: Intevac, Inc., Santa Clara, CA (US)

( * ) Notice: Subject to any disclaimer, the term of this patent is extended or adjusted under 35 U.S.C. 154(b) by 39 days.

(21) Appl. No.: 10/845,702

(22) Filed: May 14, 2004

(65) Prior Publication Data

US 2005/0252227 A1 Nov. 17, 2005

(51) Int. Cl.
| | |
|---|---|
| F25D 23/12 | (2006.01) |
| F28F 7/00 | (2006.01) |
| F28F 5/00 | (2006.01) |
| C23C 16/00 | (2006.01) |
| C23C 13/00 | (2006.01) |

(52) U.S. Cl. .................. 62/259.2; 165/80.2; 165/86; 118/724; 118/729; 204/298.09

(58) Field of Classification Search ............... 62/259.2, 62/86; 165/80.1, 80.2; 118/724, 728, 729; 204/298.09
See application file for complete search history.

(56) References Cited

U.S. PATENT DOCUMENTS

| | | | |
|---|---|---|---|
| 3,566,960 A | 3/1971 | Stuart | |
| 3,818,982 A | 6/1974 | Wagner | |
| 3,993,123 A | 11/1976 | Chu et al. | |
| 4,155,011 A | 5/1979 | Mark | |
| 4,183,797 A | 1/1980 | Kennedy et al. | |
| 4,261,762 A | 4/1981 | King | |
| 4,282,924 A | 8/1981 | Faretra | |
| 4,297,190 A | 10/1981 | Garrett | |
| 4,457,359 A | 7/1984 | Holden | |
| 4,512,391 A | 4/1985 | Harra | |
| 4,680,061 A | 7/1987 | Lamont, Jr. | |
| 4,909,314 A | 3/1990 | Lamont, Jr. | |
| 5,181,556 A | 1/1993 | Hughes | |
| 5,199,483 A | 4/1993 | Bahng | |
| 6,202,590 B1 * | 3/2001 | Kim et al. | ............... 118/723 R |
| 2004/0250996 A1 * | 12/2004 | Yi et al. | ........................ 165/86 |

OTHER PUBLICATIONS

Heat Transfer Process For High Thermal Input Processes, J. J. Cuomo IBM Technical Disclosure Bulletin, vol. 21, No. 2, Jul. 1978, PP: 840-841.
Experiments on Gas Cooling of Wafers, Monty King and Peter Rose, Nuclear Instruments and Methods 189 (1981) PP: 169-173, North-Holland Publishing Co.

* cited by examiner

Primary Examiner—Marc Norman
(74) Attorney, Agent, or Firm—Stanley Z. Cole

(57) ABSTRACT

Described is a cooling system for use in the manufacture of substrates into magnetic disk memory in which cooling plates are positioned dynamically in relation to a substrate to be cooled. This enables positioning the cooling plates closer for more effective cooling. Positioning is controlled by capacitive measurements between the cooling plates and the substrate to be cooled.

15 Claims, 4 Drawing Sheets

CAPACITANCE SENSING FOR SUBSTRATE COOLING

FIELD OF THE INVENTION

This invention has to do with the cooling of substrates in the manufacture of magnetic memory disks for computers.

BACKGROUND OF THE INVENTION

In the manufacture of hard disks for computer memories, substrates are carried into a vacuum environment where various processes are performed and where various layers are deposited onto the surfaces of the substrates. The various process steps may include for example heating the substrate, cooling the substrate, sputter coating layers onto the substrate, laying down layers using chemical vapor deposition and enhanced plasma techniques, depositing protective carbon layers on the substrate, and other like processing steps. In some instances the disk manufacturer also places a lubricant onto the final surfaces of the disk.

During the course of the described manufacturing processes, a substrate is typically held along its edges and is moved into a processing chamber where the disk is simultaneously processed on both sides of the substrate. At least following deposition of the magnetic layers and prior to the deposition of the final layers, one of which will generally comprise a carbon layer, it is generally necessary to cool the substrate and to do so very quickly. In the prior art, as exemplified by U.S. Pat. No. 5,215,420, processing stations are positioned to surround a central vacuum area. A cassette of substrates moves into the loading area of the system and then into the central area where individual disks are lifted from cassettes and carried into the system where they move sequentially through various process stations that surround the central area. A lifter holds the disk by its edges and carries the disk from station to station until the disk has been processed at all stations at which point the disk is returned to a cassette and removed from the system. One or more of the stations surrounding the central area of this type equipment is a cooling station. Such a station may appear more than once in the sequence of manufacturing a finished memory disk. Cooling, in the prior art described, has been performed by gas conduction by positioning a disk to be cooled between heat sinks, closing the cooling compartment to separate it from other compartments and from the central area of the system. A gas is then added to the closed compartment which changes the pressure in the cooling compartment by raising it toward atmospheric and to a preferred pressure for heat transfer by gas conductivity. This facilitates the transfer of heat from the disk to the heat sinks or cooling plates positioned on each side of the disk within the compartment. Gases typically used for this purpose are helium and hydrogen and mixes of the two because these gases provide good thermal conductivity for heat transfer. Generally the pressure is raised until it reaches to within about of 10 to 15 torr. While the pressure in the compartment is raised the pressure outside the compartment remains at a lower vacuum pressure of about $10^{-7}$ torr. A station, as described, is the subject of U.S. Pat. No. 5,181,556, and a system including cooling stations as described has been and currently is available commercially from Intevac, Inc. of Santa Clara, Calif. and is also sold incorporated into the Intevac's MDP 250. Noteworthy is that the system is one in which substrates are carried from station to station and are subjected to processing at each station simultaneously and during the same time interval. Although systems can operate differently, this approach has been generally accepted in the field since it is most efficient in the production of large quantities of commercially acceptable finished disks. Thus if less time were required to cool a substrate and if this lesser amount of time were adequate to perform all of the other particular operations to which the substrate is exposed the entire system would have the capability of functioning more quickly and could in a unit of time produce more finished disks. With time, commerce has demanded faster speeds from these manufacturing systems, lower costs for the manufactured disks and improved qualities in the manufactured disks including increased storage capabilities. To satisfy this need there was developed a new system which is described in pending application Ser. No. 10/361,308, filed Feb. 10, 2003. In this system the substrate is held in a slightly different manner being gripped at its edges around its circumference in a disk carrier, again however, permitting processing of both sides of the substrate. Each processing compartment is a self-contained vacuum chamber and, the holder, as in the case of the earlier units, moves from processing station to processing station where the substrate is subjected to treatment. Here too rapid cooling is an important factor. The disclosure of this pending application is incorporated herein by reference.

Heat flux leaving the substrate is proportional to $\Delta T/\Delta x$, where $\Delta T$=(Temperature of substrate)−(Temperature of cooling plate) and $\Delta x$=the gap between the substrate and cooling plate. If the cool plates are cryogenically cooled, significant improvement in the cooling rate can be difficult or impossible to achieve by increasing $\Delta T$, but by reducing the gap, $\Delta x$, one can significantly increase the cooling rate of a substrate within a cooling station. In general, the method of transporting substrates, on support carriers that grip the edges of the substrates during transport and are continuously present during the cooling step permit processing on both sides of the substrate, but require clearance between the cooling plates for the carriers during the cooling process. Thus the gap compelled by the disk carriers has an effect on and can control cooling rates for substrates. A way to reduce the required time for cooling is to place the cooling plates closer to the substrate during the cooling process, This requires movement of the heat sinks toward and away from the substrate being cooled in order to permit movement of the substrate into and out of the cooling compartment. Without a technique of dynamically measuring the gap between the substrate and moving cooling plates, the gap is restricted by the accuracy of the placement of the substrate between the plates. In other words, if the placement of the plane of the substrate can vary in position $\pm\epsilon$, then the plate can not be moved any closer than $\epsilon$ to the substrate without risking contact. This restricts the plate from coming closer than about ~0.100 inch in processing systems of the type now in use. However, if the plate could be placed ~0.025 inches from the substrate, for example, one fourth the distance described in the previous sentence, four times the heat flux could be carried away from the substrate. What is of interest in this technology is to be able to work with the surfaces with a separation of less than about 0.100 inch apart and particularly with a separation in a range of from about 0.02 inches to about 0.050 inches.

SUMMARY OF THE INVENTION

The invention described provides a method and apparatus for dynamically measuring the gap between the substrate and cooling plates as to enable safe operation with gaps of the order, for example, of 0.02 to 0.05 inches, thereby speeding the cooling process and enabling faster operations in the manufacture of completed disks. The way this is achieved is to control spacing between the substrates and the cooling plates by moving the cooling plates and dynamically measuring and controlling the gaps that are present. In the embodiment herein described the cooling plates of the cooling compartment and substrate are used to form parallel plate capacitors so that when the plates get closer, the capacitance increases. By measuring the capacitance, the gap becomes known. With two cooling plates, one plate can be moved closer to the substrate until the capacitance is measured which corresponds to the desired gap. Then the second cooling plate on the other side of the substrate being cooled is moved again increasing the capacitance until the capacitance is measured that corresponds to the desired gap. A variation on this is to measure capacitance and control spacing during the simultaneous movement of the cooling plates to achieve spacings as desired. Any one of a number of techniques can be used to measure the capacitance. The embodiment of this invention described below is a preferred approach. However, it should be understood that other approaches would readily be understood from the disclosure, which follows. It should also be understood that although this invention may be incorporated into a complete disk making unit, it may also be made available independently of a system and added to an existing system.

DETAILED DESCRIPTION OF THE INVENTION

Figure 1:
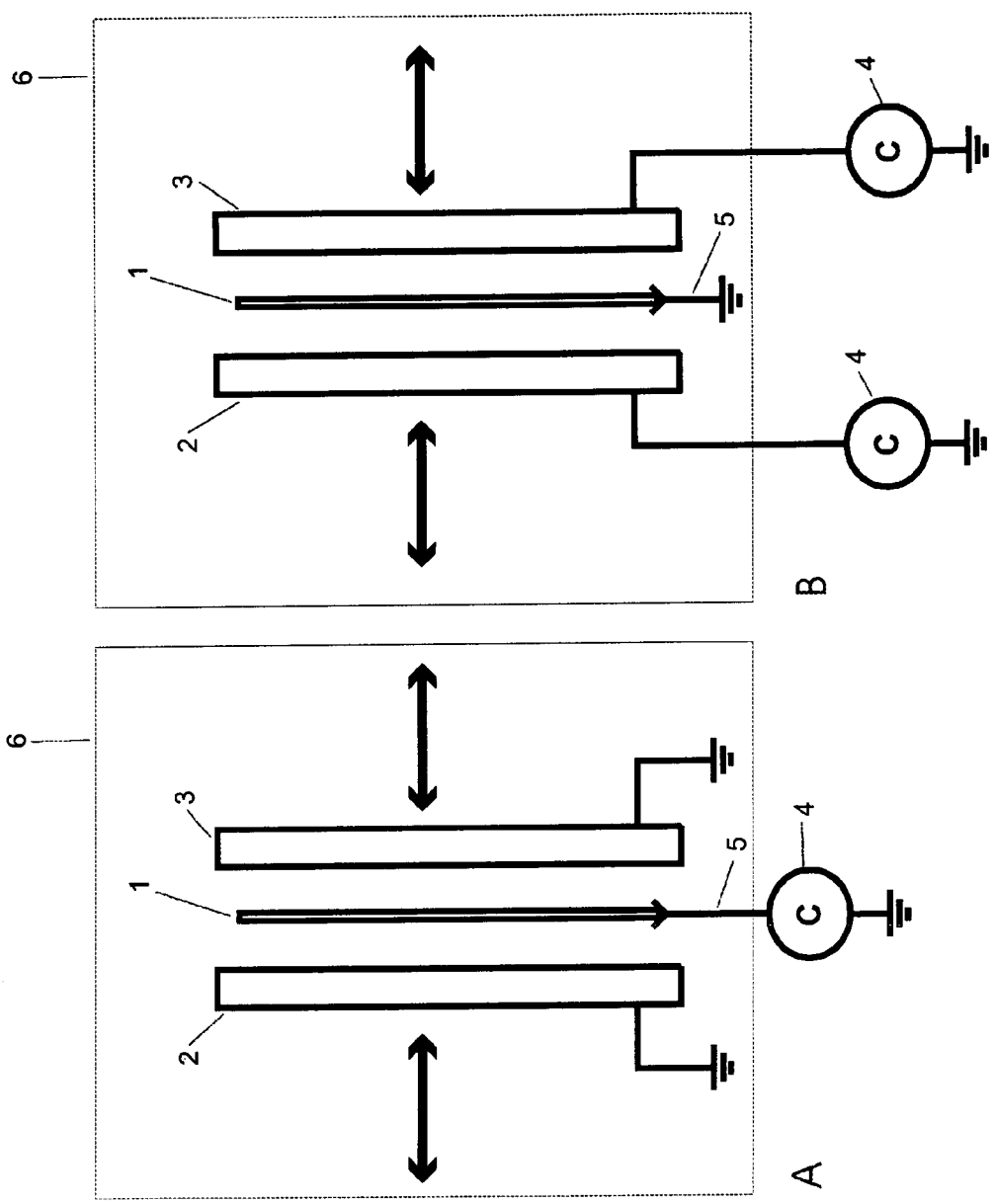
FIG. 1 is a schematic illustration of a measuring system shown in two embodiments, FIG. 1A and FIG. 1B.

Referring now to FIG. 1, in FIG. 1A there is illustrated an embodiment in which cooling plates 2 and 3 are grounded and the capacitance between the substrate 1 and the cooling plates 2 and 3 is measured by capacitance monitor 4. In this embodiment, cooling plates 2 and 3 are placed into position sequentially. In FIG. 1B the substrate is grounded and the capacitance between the cooling plates 2 and 3 and the substrate 1 is measured by capacitance monitors 4 in the circuit of the two cooling plates. The embodiment illustrated in FIG. 1B illustrates an embodiment in which the cooling plates may be moved simultaneously since the monitors can provide independent measurements and controls. This will occur because the substrate is grounded as to permit independent information concerning the capacitance between each plate and the substrate to be available for use in controlling independent movement of each plate. In each of these figures, substrate 1 is in position on a disk holder 5 and the substrate, and two cooling plates are all within housing 6. When the cooling step is completed the cooling plates move away from the substrate and do so simultaneously after which the substrate may be moved from the cooling compartment.

Although measurements between the substrate and the cooling plates could be made using optical or inductive techniques to control spacing, capacitance can be measured with a simple circuit that is much less expensive than if optical or inductive sensors were employed. Also the gap may be automatically adjusted correctly if there is a slight tilt to the substrate. This is understood if one considers that the capacitance is proportional to $$\int \frac{dA}{x}$$

where dA is an element of the surface of the substrate, x is the gap length, and the integral is over the surface of the substrate. Similarly, the heat flux from the substrate is proportional to the same integral. Thus, if there is a small tilt to the substrate, the gap that results in the set capacitance will provide the desired cooling.

Figure 2:
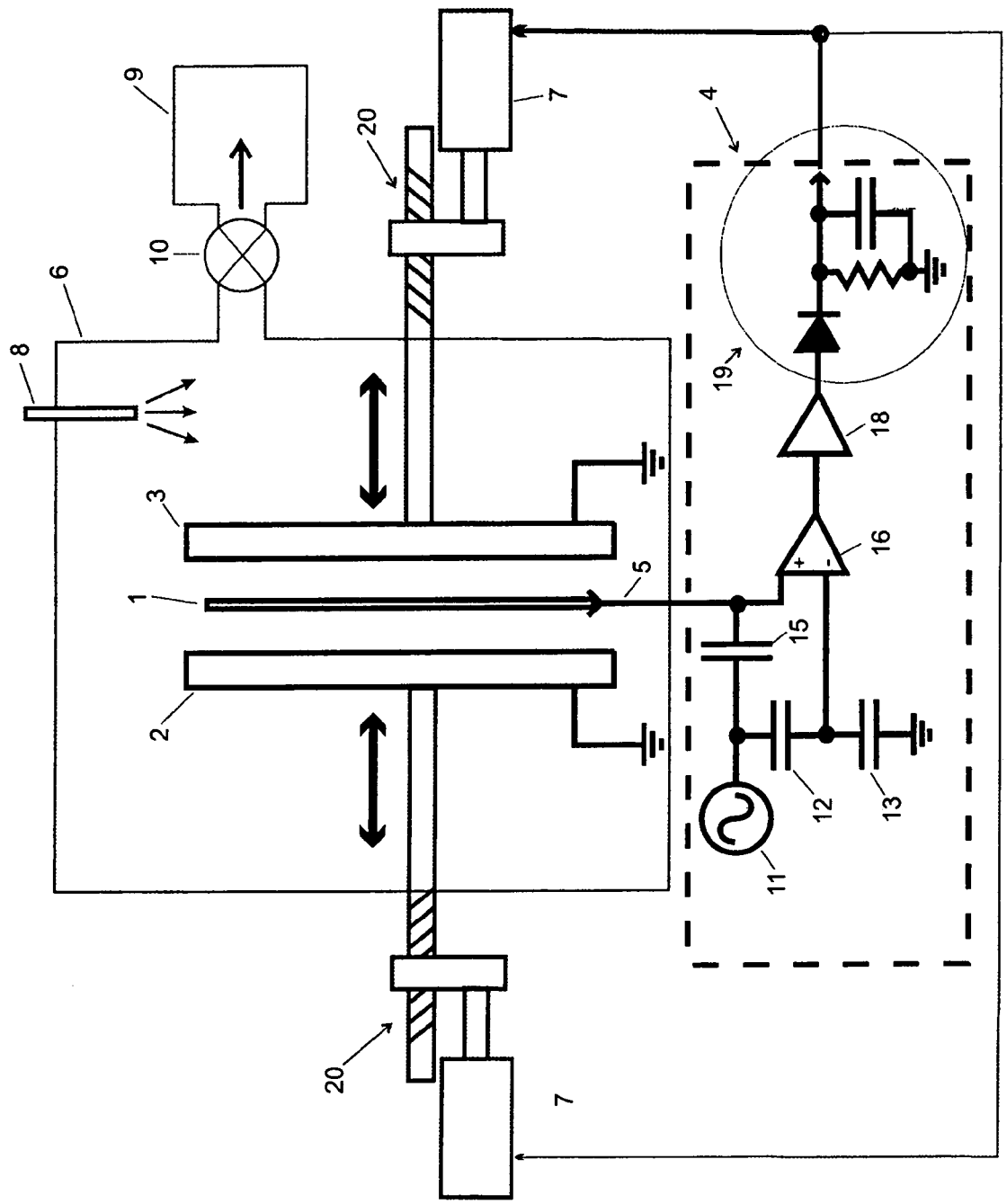
FIG. 2 is a schematic illustration of an embodiment of a dynamic cooling system in which capacitance is measured using a reference capacitor.

FIG. 2 illustrates one technique to measure the capacitance in the circuit. In this Figure, as in FIG. 1, 1 represents the substrate to be cooled, 2 and 3 represent the cooling plates, 5 represents the substrate carrier or lifter to support the substrate in the cooling chamber defined by walls 6. In FIG. 2, the capacitance measuring circuit 4 measures the capacitance between the substrate and the cooling plates. Oscillator 11 provides an AC signal with a single frequency. The frequency of the sine wave is somewhat arbitrary, but it is convenient to use a frequency that is low enough that stray inductance and capacitance does not cause confusion but is also high enough that the filtering from AC to DC can result in a signal with sufficient bandwidth to satisfy response times required for the application (10 kHz to 1 MHz, for example). The AC signal is reduced by a capacitive voltage divider comprising capacitor 15 and the capacitance measured between the substrate and the cooling plates. Capacitors 12 and 13 comprise a reference voltage divider that reduces the same AC signal. The value of capacitor 13 can be chosen to be equal to the capacitance of the substrate to cooling plates in the initial state with the plates apart. For this initial condition the two input voltages into the difference amplifier 16 are equal, which will lead to an output voltage ~0V when the cooling plates are in the "out" position. As the drive assemblies 7 move the plates in, the capacitance between the substrate and the cooling plates increases, resulting in a sine wave output which increases in magnitude as the plates get closer to the substrate. In the example shown, the output of the difference amplifier 16 is amplified with a bandpass amplifier 18. This provides a method of increasing the signal to noise ratio, since the signal is amplified but most of the noise spectrum is not. The AC signal must then be rectified by a rectifier 19 to be useful as a control signal.

The rectifier can be one of many types, such as a diode circuit as shown, or an RMS (Root Mean Square) amplifier. The output of the capacitance sensing circuit 4 can be used by motor controllers which control the drive circuits 7. Because there is only one sensing circuit in this Figure, one plate must be moved into position, then the second. (In FIG. 1B a circuit arrangement is provided to move both cooling plates at the same time relative to the substrate being cooled.) For each side, the motor controller can be given a set point that corresponds to the sensor signal a fixed distance from the desired final position. The pre-set velocity and deceleration will determine what that fixed distance is (i.e. the distance the plate will travel between the time it begins to stop and the time it comes to a complete stop). In a case in which there is a single control for each plate, when the first plate completes its motion, the second plate can start its motion. The second plate motion is stopped when the capacitance sensor signal reaches a second threshold which is higher than the first and corresponds to a capacitance sensor signal for a position a similar fixed distance before the desired final position. As should be apparent both sides can be made to move simultaneously by adding a second sensing circuit in the arrangement shown in FIG. 1B. However, this has not been found necessary for the speed of the system now being used.

In operation, a substrate 1 is moved into position within cooling chamber 6. The chamber is sealed and gas such as helium or hydrogen or a mixture of the two is fed into chamber 6 using tubular connection 8 to increase the pressure within the chamber to that desired for conductive heat transfer. Cooling plate 2 is then moved by driver 7 to the desired position and then cooling plate 3 is moved to a like desired position. The pates 2 and 3 are maintained in this position for the desired time. Thereafter the pressure in the chamber is again lowered to the level of the vacuum surrounding the chamber using the vacuum pump 10 and the cooling plates are separated away from substrate 1. The chamber is opened and the substrate is then removed from chamber 6 and travels on for additional processing. The substrate then may be moved into other process stations for further processing. In all, it takes about 3.5 seconds from the time a substrate enters the compartment until the time it exits the compartment. This is typically the case in a compartment fitted for the system described in application Ser. No. 10/361,308 when the system is running at a speed to produce about 800 completed disks per hour which permits the passage of a second to transport the disks between processing stations.

Figure 3:
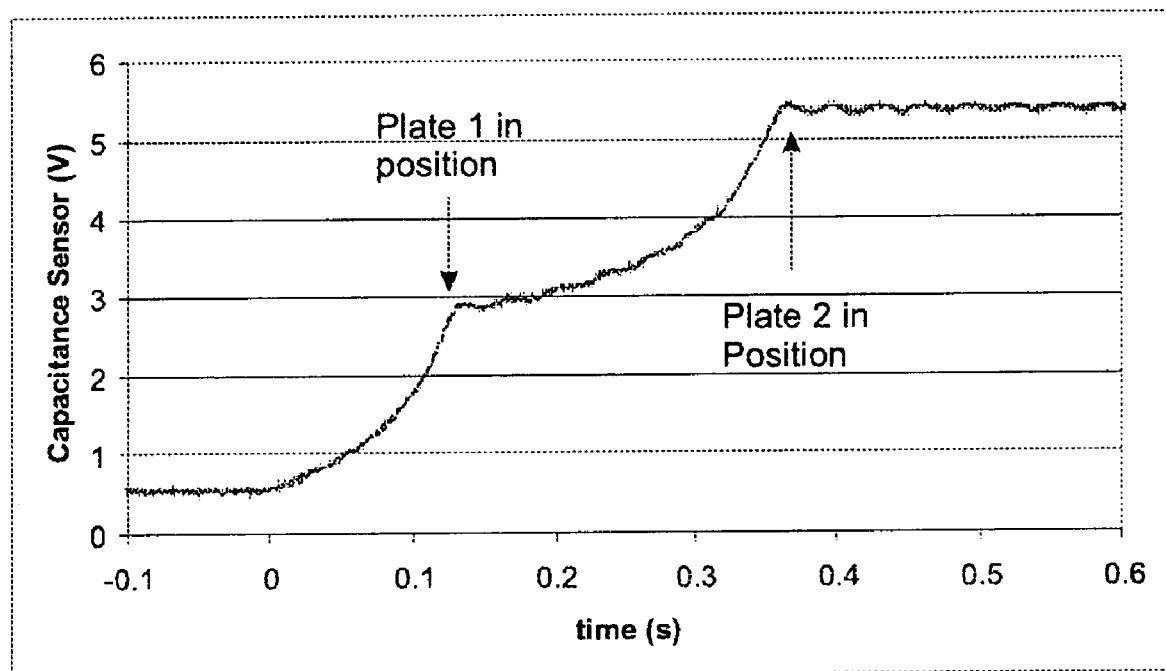
FIG. 3 shows data from the capacitance measurements using the embodiment of FIG. 2.

FIG. 3 shows the output for a system as described above in which a programmable servo motor controller 20 (see FIG. 2) is programmed to compare the capacitance sensor signal to a reference analog signal (set point) and move at a determined velocity inward until the two signals are equal then with a determined deceleration, stop. The set point thus corresponds to a position that is a fixed distance from the desired end point. When the first plate completes its move, a signal is sent to the servo controller 20 of the second plate to move the other cooling plate into position close to the substrate. For the data shown, the plates moved from a gap of 0.225" to 0.025" in less than 150 ms. At a gap of 0.225 inches the substrate has adequate space to enter between the two cooling plates notwithstanding the presence of the substrate carrier or lifter holding the substrate. Substrates are cooled by 30° C. to 50° C. depending on conditions such as spacings, pressures, time, original temperature, etc.

Figure 4:
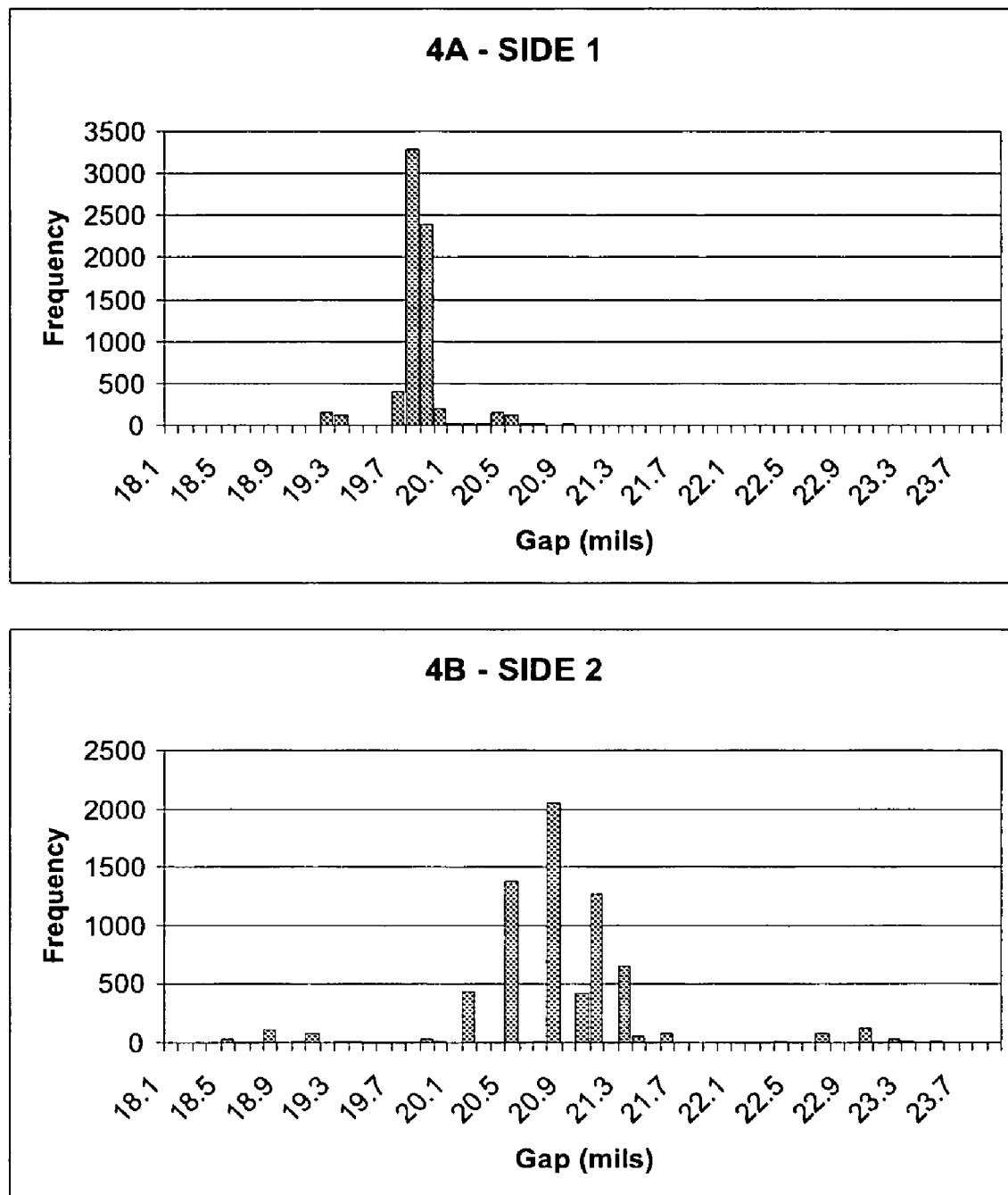
FIG. 4 illustrates the reproducibility of data in accordance with the illustrated embodiment.

FIG. 4 shows some data from a test of the reproducibility of the mechanism described in connection with FIG. 2. In this case, instead of a substrate, a stationary plate was used with two moving plates adjacent to each side with inductive sensors mounted in the stationary plate to measure the final position of the plates relative to the stationary plate. No attempt was made to make the two sides move to a similar distance separated from the stationary plate. The object instead for this set of graphs was reproducibility. After more than 6,000 cycles the chart below and FIGS. 4A and 4B show the results obtained.

|        | Average | Minimum | Maximum | Standard Deviation |
|--------|---------|---------|---------|--------------------|
| Side A | .0198"  | .0191   | .0216   | .0002              |
| Side B | .0208   | .0182   | .0237   | .0006              |

The B-side had a larger range because errors in A-side shift the read back at the desired B location. This is not necessarily bad, since if A ends up too close, B will tend to end farther away. This data illustrates that the method described can result in very precise reproducible placement of the cooling plates using a simple circuit. Although these two plates equivalent to the cooling plates were not set in this experiment to adjust to an equal distance from the central plate, there is no question that such a result can obtain with a proper setting controlling movements and distances.

While there has been shown and discussed what are presently considered a preferred embodiment, it will be obvious to those skilled in the art that various changes and modifications may be made without departing from the scope of this invention and the coverage of the appended claims.

What is claimed is:

1. Cooling apparatus to cool substrates used in the manufacture of magnetic disks, comprising,
   a vacuum compartment to cool disks in a magnetic disk making equipment,
   cooling plates within said compartment,
   means to place a substrate to be cooled between said cooling plates,
   said cooling plates being electrically connected to create capacitance between
   said plates and a substrate to be cooled in position between said plates,
   a servo motor controller programmed to compare the capacitance between said plates and said substrate and move said plates until each said plate is in position substantially parallel to said substrate and separated therefrom by less than 0.1 inch.

2. The cooling apparatus of claim 1 in which said plates move into position to a desired gap of less than 0.1 inches in less than about 150 m.

3. The cooling apparatus of claim 1 in which said plates move into position one after the other.

4. The cooling apparatus of claim 1 in which said plates move into position simultaneously.

5. A cooling compartment comprising an enclosed chamber, two cooling plates positioned within said chamber, an opening to permit the insertion and removal of a substrate on a support therefor into and out of said chamber, a motor drive system to move said cooling plates close to and into substantial parallel position with a substrate in said chamber, a capacitance controller system to measure capacitance between each said cooling plate and a substrate in position within said chamber and to control drive circuits to position said cooling plates in said chamber in respect to said substrate, and a pump and feed system to control the pressure and environment within said chamber.

6. A cooling compartment in accordance with claim 5 in which the pressure within said chamber is increased at the time of cooling to between about 10 to 15 torr.

7. A cooling compartment in accordance with claim 6, in which the vacuum is pumped down to about $10^{-7}$ torr following cooling of the substrate and prior to removal of the substrate from the compartment.

8. The apparatus of claim 5 in which the entire cooling cycle occurs in said chamber within about 3.5 seconds.

9. The apparatus of claim 5 in which said cooling plates are positioned closer to said substrate than is possible if said cooling plates are positioned as to enclose the support mechanism for a substrate to be cooled.

10. A method of cooling a substrate being processed in the manufacture of magnetic disks, comprising placing a substrate to be cooled into
- a cooling compartment between cooling plates,
- applying an AC voltage between said cooling plates and said substrate,
- measuring the capacitance between said plates and said substrate,
- moving said cooling plates closer to said substrate using the measurement of capacitance between said plates and said substrate until said plates are positioned a desired distance less than 0.1 inches from said substrate as selected prior to movement of said plates.

11. The method of claim 10 in which said desired distance comprises between about 0.02 to 0.05 inches.

12. The method of claim 10 in which the spacing between said plates and said substrate is achieved by moving and measuring capacitance of a plate to the substrate one plate at a time.

13. The method of claim 10 in which the spacing between said plates and said substrate is achieved by moving said plates and determining capacitance for each of said plates simultaneously and stopping movement at a defined distance as determined by capacitance measurements.

14. The method of claim 10 in which the set point for the cooling plate to stop is short of the final stopping point.

15. Cooling apparatus to cool substrates used in the manufacture of magnetic disks, comprising, a vacuum compartment to cool disks in a magnetic disk making equipment,
- cooling plates separated from one another while in a facing relationship within said compartment,
- a substrate support to place a substrate to be cooled between said cooling plates,
- said cooling plates being electrically connected to enable electrical measurements to determine distances between said plates and between a substrate to be cooled in position between said plates,
- a motor programmed to move said plates as controlled by said electrical measurements until each said plate is in position substantially parallel to said substrate while separated therefrom by less than 0.1 inch, and
- connections to introduce and remove a cooling gas from said compartment.

* * * * *

UNITED STATES PATENT AND TRADEMARK OFFICE
CERTIFICATE OF CORRECTION

PATENT NO. : 7,000,418 B2
DATED : February 21, 2006
INVENTOR(S) : Rogers et al.

It is certified that error appears in the above-identified patent and that said Letters Patent is hereby corrected as shown below:

Column 6,
Line 36, change "m." to -- ms. --.

Signed and Sealed this

Twenty-third Day of May, 2006

JON W. DUDAS
*Director of the United States Patent and Trademark Office*